United States Patent
Miyanami

(10) Patent No.: US 9,602,746 B2
(45) Date of Patent: Mar. 21, 2017

(54) IMAGE PICKUP DEVICE AND ELECTRONIC APPARATUS

(71) Applicant: Sony Corporation, Tokyo (JP)

(72) Inventor: Yuki Miyanami, Kanagawa (JP)

(73) Assignee: Sony Corporation, Tokyo (JP)

( * ) Notice: Subject to any disclaimer, the term of this patent is extended or adjusted under 35 U.S.C. 154(b) by 22 days.

(21) Appl. No.: 14/313,409

(22) Filed: Jun. 24, 2014

(65) Prior Publication Data

US 2015/0002716 A1   Jan. 1, 2015

(30) Foreign Application Priority Data

Jul. 1, 2013   (JP) .................................. 2013-138263

(51) Int. Cl.
| | |
|---|---|
| *H04N 5/3745* | (2011.01) |
| *H04N 5/374* | (2011.01) |
| *H01L 27/146* | (2006.01) |

(52) U.S. Cl.
CPC ..... *H04N 5/3745* (2013.01); *H01L 27/14612* (2013.01); *H01L 27/14643* (2013.01); *H01L 27/14689* (2013.01); *H04N 5/3742* (2013.01)

(58) Field of Classification Search
CPC .... H04N 5/374; H04N 5/3742; H04N 5/3745; H04N 5/378; H01L 27/14612; H01L 27/14643; H01L 27/14689; H01L 27/1463; H01L 27/14632
See application file for complete search history.

(56) References Cited

U.S. PATENT DOCUMENTS

| | | | | |
|---|---|---|---|---|
| 2002/0081793 A1* | 6/2002 | Yang | ................. | H01L 21/76264 438/200 |
| 2006/0255371 A1* | 11/2006 | Roy | ................... | H01L 27/14609 257/223 |
| 2010/0193914 A1* | 8/2010 | Nakamura | ........ | H01L 27/14609 257/618 |
| 2011/0062542 A1* | 3/2011 | Adkisson | .......... | H01L 27/14609 257/461 |

FOREIGN PATENT DOCUMENTS

JP    2008-205022 A    9/2008

* cited by examiner

*Primary Examiner* — Daniel M Pasiewicz
(74) *Attorney, Agent, or Firm* — Sheridan Ross P.C.

(57) ABSTRACT

An image pickup device includes on a silicon layer: a photodiode provided on each pixel basis to perform photoelectric conversion to generate a charge depending on the light receiving amount; a floating diffusion section configured to store the charge generated by the photodiode; and a transistor configured to output a pixel signal at a voltage in accordance with a level of the charge stored in the floating diffusion section, wherein the image pickup device further includes a hermetically-sealed cavity section inside the silicon layer and on at least one of the underside of the floating diffusion section and the underside of a channel body region of the transistor.

14 Claims, 9 Drawing Sheets

IMAGE PICKUP DEVICE AND ELECTRONIC APPARATUS

CROSS REFERENCE TO RELATED APPLICATIONS

This application claims the benefit of Japanese Priority Patent Application JP 2013-138263 filed on Jul. 1, 2013, the entire contents of which are incorporated herein by reference.

BACKGROUND

The present technology relates to an image pickup device, and an electronic apparatus that includes such an image pickup device.

In recent years, an image pickup device, such as a CMOS (Complementary Metal Oxide Semiconductor) image sensor and a CCD (Charge-Coupled Device) has been widely in use for a digital still camera, a digital video camera, and the like. Such an image pickup device may be configured to include on each pixel basis, for example, a photodiode, and a signal readout circuit for externally reading out a photoelectric conversion signal that is obtained by the photodiode. The signal readout circuit may be configured to include, for example, a transfer transistor, an amplifying transistor, a reset transistor, a selection transistor, and the like (for example, see Japanese Unexamined Patent Application Publication No. 2008-205022). In some cases, these transistors may be shared among the plurality of photodiodes.

To aim at achievement of the low illuminance characteristics comparable to a currently-available ultrasensitive image sensor, it is desired to reduce a capacitance in a signal readout circuit for improving the conversion efficiency of an image pickup device. In the past, for example, diffusive device separation regions may have been formed on either side of an FD (Floating Diffusion) section and the like.

SUMMARY

However, even though the diffusive device separation region is formed, a capacitance is not reduced substantially, and a diffusion layer capacitance is large, which has caused an issue that the conversion efficiency is not improved significantly.

It is desirable to provide an image pickup device capable of improving the conversion efficiency, and an electronic apparatus that includes such an image pickup device.

According to an embodiment of the present technology, there is provided an image pickup device, including on a silicon layer: a photodiode provided on each pixel basis to perform photoelectric conversion to generate a charge depending on the light receiving amount; a floating diffusion section configured to store the charge generated by the photodiode; and a transistor configured to output a pixel signal at a voltage in accordance with a level of the charge stored in the floating diffusion section, wherein the image pickup device further includes a hermetically-sealed cavity section inside the silicon layer and on at least one of the underside of the floating diffusion section and the underside of a channel body region of the transistor.

According to an embodiment of the present technology, there is provided an electronic apparatus provided with an image pickup device and a signal processing circuit configured to carry out a predetermined processing operation for a pixel signal to be output from the image pickup device, the image pickup device including on a silicon layer: a photodiode provided on each pixel basis to perform photoelectric conversion to generate a charge depending on the light receiving amount; a floating diffusion section configured to store the charge generated by the photodiode; and a transistor configured to output a pixel signal at a voltage in accordance with a level of the charge stored in the floating diffusion section, wherein the image pickup device further includes a hermetically-sealed cavity section inside the silicon layer and on at least one of the underside of the floating diffusion section and the underside of a channel body region of the transistor.

In the image pickup device and the electronic apparatus according to the embodiments of the present technology, the hermetically-sealed cavity section is provided inside the silicon layer and on at least one of the underside of the floating diffusion section and the underside of a channel body region of the transistor. This ensures that a p-n junction region is not present on at least one of the underside of the floating diffusion section and the underside of a channel body region of the transistor, resulting in a capacitance of a diffusion layer being reduced.

According to the image pickup device and the electronic apparatus in the embodiments of the present technology, the hermetically-sealed cavity section is provided inside the silicon layer and on at least one of the underside of the floating diffusion section and the underside of a channel body region of the transistor, which makes it possible to improve the conversion efficiency.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to explain the principles of the present technology.

DETAILED DESCRIPTION

Hereinafter, some embodiments of the present technology are described in details with reference to the drawings. It is to be noted that the description is provided in the order given below.
1. First Embodiment (Image Pickup Device)
(An example where cavities are provided on the underside of an FD and on the underside of an amplifying transistor)
2. Modification Examples (Image Pickup Device)
First Modification Example: an example where a cavity is provided on either one of the underside of an FD and the underside of an amplifying transistor.
Second Modification Example: an example where separation sections are provided on either side of an FD and on either side of an amplifying transistor.
3. Second Embodiment (Image Pickup Module)
4. Third Embodiment (Electronic Apparatus)
(1. First Embodiment)
[Configuration]

Figure 1:
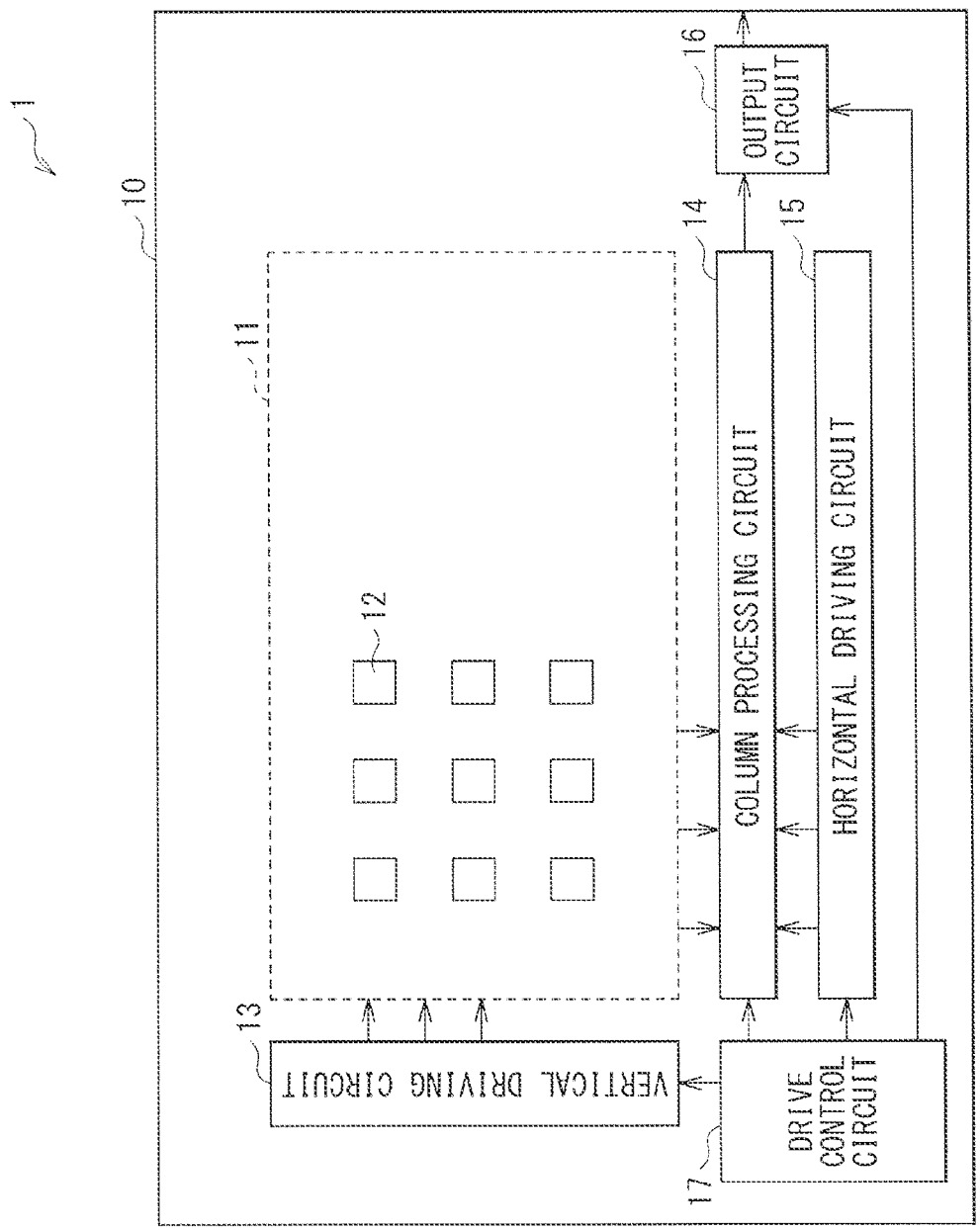
FIG. 1 is a schematic block diagram showing an example of a simplified configuration of an image pickup device according to a first embodiment of the present technology.

FIG. 1 shows an example of a simplified configuration of an image pickup device 1 according to a first embodiment of the present technology. The image pickup device 1 is a CMOS solid-state image pickup device that is applicable to both of a backside illumination type and a front-side illumination type. The image pickup device 1 includes a pixel region 11 in which a plurality of pixels 12 are arranged in a matrix pattern, and peripheral circuits. The pixel region 11 and the peripheral circuits are formed on a common silicon layer 10. The silicon layer 10 may be, for example, a part of a silicon substrate or a part of an SOI (Silicon on Insulator) substrate. As the peripheral circuits, the image pickup device 1 may include, for example, a vertical driving circuit 13, a column processing circuit 14, a horizontal driving circuit 15, an output circuit 16, and a drive control circuit 17.

The vertical driving circuit 13 may, for example, select the plurality of pixels 12 in sequence on each row basis. The column processing circuit 14 may, for example, carry out a CDS (Correlated Double Sampling) processing operation for a pixel signal to be output from each pixel 12 in a row that is selected by the vertical driving circuit 13. The column processing circuit 14 may, for example, extract a signal level of the pixel signal by performing the CDS processing operation for such a pixel signal to hold pixel data depending on the light receiving amount of each of the pixels 12. The horizontal driving circuit 15 may, for example, drive the output circuit 16 to sequentially output the pixel data held in the column processing circuit 14. The output circuit 16 may, for example, amplify the incoming pixel data to output the resultant pixel data to an external signal processing circuit. The drive control circuit 17 may, for example, control driving of each block in the peripheral circuits (the vertical driving circuit 13, the column processing circuit 14, the horizontal driving circuit 15, and the output circuit 16).

Figure 2:
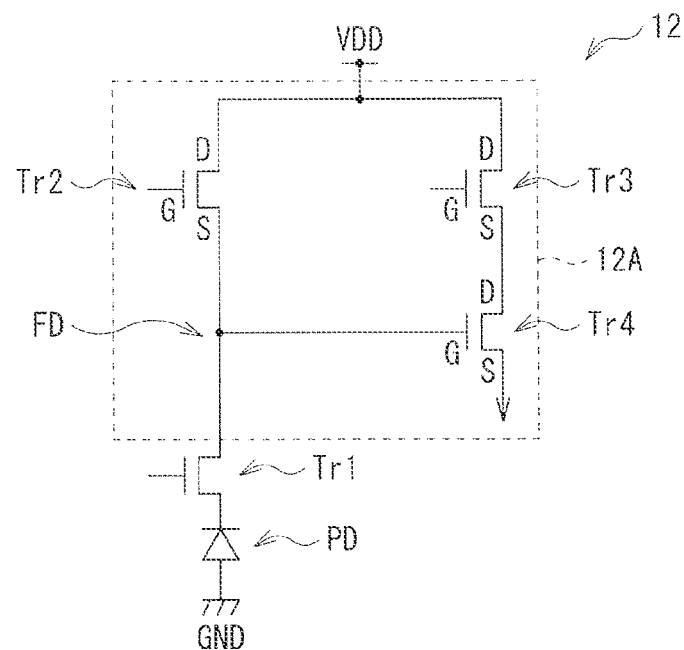
FIG. 2 is a circuit diagram showing an example of a circuit configuration of a pixel illustrated in FIG. 1.

FIG. 2 shows an example of a circuit configuration of the pixel 12. The pixel 12 may have, for example, a photodiode PD, a transfer transistor Tr1, and a readout circuit 12A. The photodiode PD performs photoelectric conversion to generate a charge depending on the light receiving amount. It is to be noted that the readout circuit 12A may be shared among the plurality of pixels 12. The readout circuit 12A may be configured to include, for example, a floating diffusion section FD, a reset transistor Tr2, a selection transistor Tr3, and an amplifying transistor Tr4. The floating diffusion section FD stores charges generated by the photodiode PD.

A cathode of the photodiode PD is connected with a source of the transfer transistor Tr1, and an anode of the photodiode PD is connected with a reference potential line (for example, ground). A drain of the transfer transistor Tr1 is connected with the floating diffusion section FD, and a gate of the transfer transistor Tr1 is connected with the vertical driving circuit 13. A source of the reset transistor Tr2 is connected with the floating diffusion section FD, and a drain of the reset transistor Tr2 is connected with a power line VDD and a drain of the selection transistor Tr3. A gate of the reset transistor Tr2 is connected with the vertical driving circuit 13. A source of the selection transistor Tr3 is connected with a drain of the amplifying transistor Tr4, and a gate of the selection transistor Tr3 is connected with the vertical driving circuit 13. A source of the amplifying transistor Tr4 is connected with the column processing circuit 14, and a gate of the amplifying transistor Tr4 is connected with the floating diffusion section FD.

The reset transistor Tr2 resets a potential of the floating diffusion section FD to a potential of the power line VDD once the reset transistor Tr2 turns on. The selection transistor Tr3 controls a timing to output a pixel signal from the readout circuit 12A. The amplifying transistor Tr4 configures a source-follower amplifier, and outputs a pixel signal at a voltage depending on a level of a charge generated by the photodiode PD. When the selection transistor Tr3 turns on, the amplifying transistor Tr4 amplifies the potential of the floating diffusion section FD to output a voltage in accordance with the potential to the column processing circuit 14.

Figure 3:
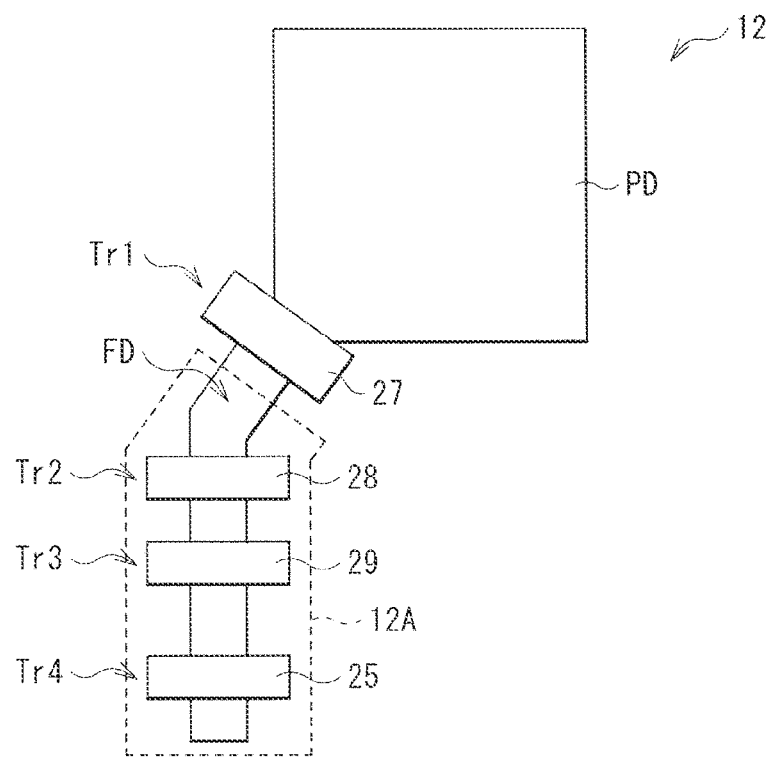
FIG. 3 is a schematic diagram showing an example of an in-plane layout of the pixel illustrated in FIG. 1.

FIG. 3 shows an example of an in-plane layout of the pixel 12. It is to be noted that the in-plane layout of the pixel 12 is not limited to that illustrated in FIG. 3. The pixel 12 may have, for example, the photodiode PD, the floating diffusion section FD, and the readout circuit 12A on the silicon layer 10. Between the photodiode PD and the floating diffusion section FD, the transfer transistor Tr1 is arranged. The gate (transfer gate electrode 27) of the transfer transistor Tr1 may be formed of, for example, a polysilicon electrode. The reset transistor Tr2, the selection transistor Tr3, and the amplifying transistor Tr4 that configure the readout circuit 12A are arranged side by side in line. The reset transistor Tr2, the selection transistor Tr3, and the amplifying transistor Tr4 share a single active region. The drain of the reset transistor Tr2 and the drain of the selection transistor Tr3 are commonalized, and the source of the selection transistor Tr3 and the drain of the amplifying transistor Tr4 are commonalized. Each of the gates (reset gate electrode 28, selection gate electrode 29, and amplifying gate electrode 25, respectively) of the reset transistor Tr2, the selection transistor Tr3, and the amplifying transistor Tr4 may be formed of, for example, a polysilicon electrode.

Figure 4:
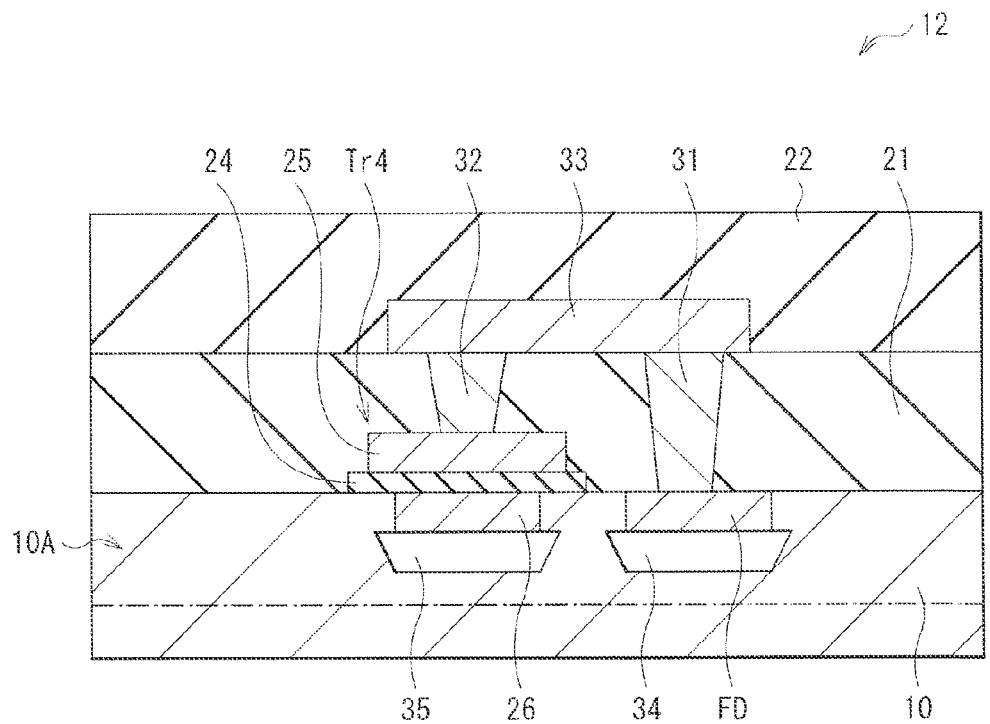
FIG. 4 is a schematic diagram showing an example of a partial cross-sectional configuration of the pixel illustrated in FIG. 1.

FIG. 4 shows an example of a partial cross-sectional configuration of the pixel 12. The pixel region 11 including the plurality of pixels 12 may be configured to laminate, for example, an interlayer insulating film 21 and an interlayer insulating film 22 in this order on the silicon layer 10. The silicon layer 10 may have, for example, a well layer 10A on a part of the top surface and in the vicinity thereof, and a layer of the conductivity type different from that of the well layer 10A at a region other than the above-described region. The photodiode PD may be formed on, for example, a layer of the conductivity type different from that of the well layer 10A. When the conductivity type of the well layer 10A is a p-type, the photodiode PD may be formed on, for example, an n-layer inside the silicon layer 10. On the well layer 10A, the floating diffusion section FD of the conductivity type different from that of the well layer 10A and a channel body region 26 of the conductivity type different from that of the well layer 10A are formed. On either side of the floating diffusion section FD and on either side of the channel body region 26, diffusive device separation regions with the impurity concentration higher than that of the well layer 10A may be formed as necessary. It is to be noted that the diffusive device separation region refers to a diffusive separation region which is configured of an impurity diffusion region of the conductivity type different from that each of the floating diffusion section FD and the channel body region 26.

Inside the interlayer insulating film 21, there are provided a gate insulating film 24, an amplifying gate electrode 25, as well as connecting sections 31 and 32. The gate insulating film 24 is formed in contact with the channel body region 26, and the amplifying gate electrode 25 is formed on the gate insulating film 24 in contact with the top surface of the gate insulating film 24. The connecting section 31 is formed on the floating diffusion section FD in contact with the top surface of the floating diffusion section FD. The connecting section 32 is formed on the amplifying gate electrode 25 in contact with the top surface of the amplifying gate electrode 25. Inside the interlayer insulating film 22, there is provided a wiring layer 33. The wiring layer 33 is connected with the connecting section 31 and the connecting section 32, and makes an electrical connection between the amplifying gate electrode 25 and the floating diffusion section FD via the connecting sections 31 and 32.

Figure 5:
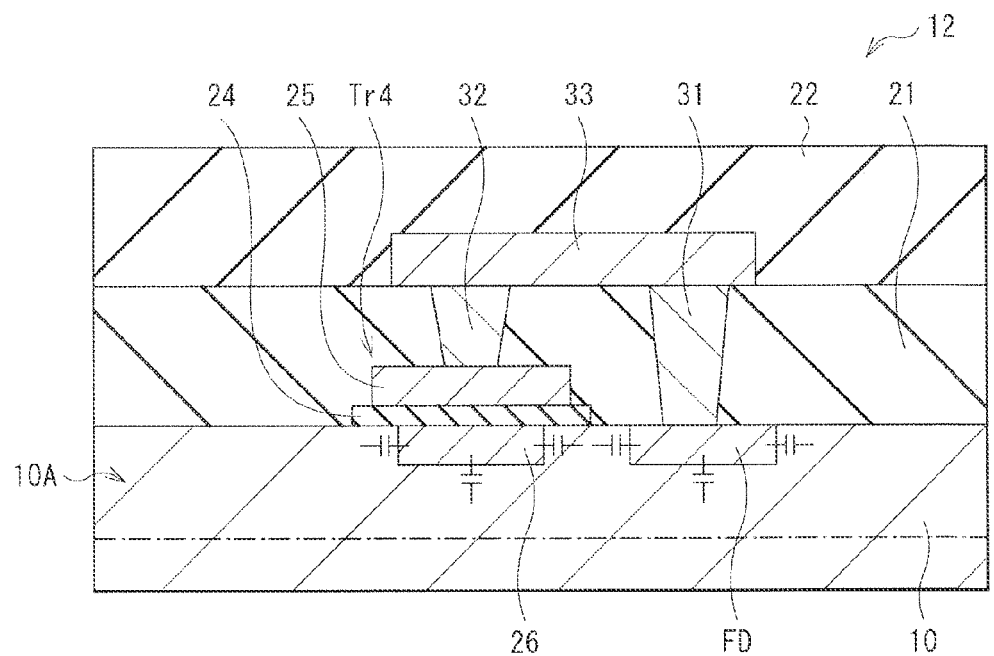
FIG. 5 is a schematic diagram showing an example of a partial cross-sectional configuration of a pixel according to a comparative example.

Further, the pixel region 11 has cavity sections 34 and 35 that are hermetically-sealed with silicon inside the silicon layer 10 and on both of the underside of the floating diffusion section FD and the underside of the channel body region 26 of the amplifying transistor Tr4. The cavity section 34 is formed in contact with the floating diffusion section FD, and the cavity section 35 is formed in contact with the channel body region 26. Therefore, a p-n junction region is not present on the bottom surfaces of the floating diffusion section FD and the channel body region 26. It is to be noted that, when a surrounding area each of the floating diffusion section FD and the channel body region 26 is the well layer 10A, for example, as shown in FIG. 5, a diffusion layer capacitance may occur in these surrounding areas (that is, on the bottom surfaces and side surfaces).

Each of the cavity sections 34 and 35 is in the shape of a low-profile flat plate, and is formed at a region quite slightly away from the top surface of the silicon layer 10. As described hereinafter, for example, the cavity sections 34 and 35 may be formed in such a manner that a hydrogen annealing treatment is carried out after a plurality of trenches are formed on the silicon layer 10, and silicon at the periphery of the plurality of trenches on the silicon layer 10 is migrated.

[Manufacturing Method]

Figure 6A:
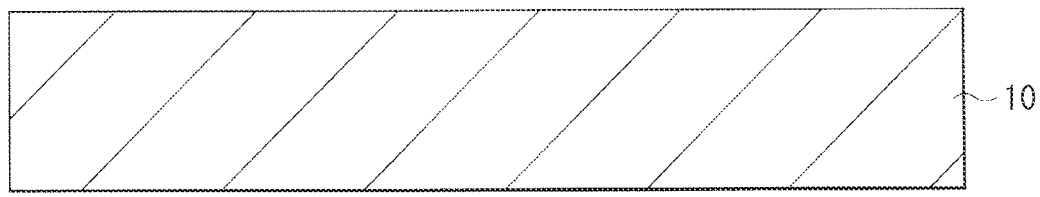
FIG. 6A is a cross-sectional view showing an example of a manufacturing process for the image pickup device illustrated in FIG. 1.
Figure 6B:
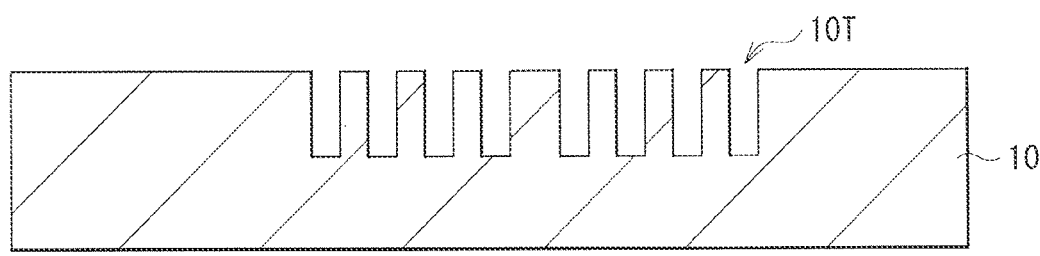
FIG. 6B is a cross-sectional view showing an example of a manufacturing process following on the manufacturing process shown in FIG. 6A.
Figure 6C:
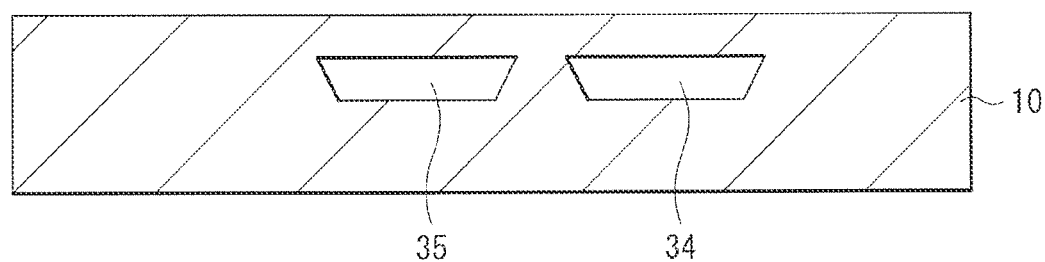
FIG. 6C is a cross-sectional view showing an example of a manufacturing process following on the manufacturing process shown in FIG. 6B.

Next, the description is provided on an example of a method of manufacturing the image pickup device 1. FIGS. 6A, 6B, 6C, 7A, and 7B show manufacturing processes for the image pickup device 1 in sequence. First, the silicon layer 10 is prepared (FIG. 6A). Next, a plurality of trenches 10T are formed by carrying out patterning utilizing, for example, a dry etching (or wet etching) process by the use of a photolithographic approach (FIG. 6B). The plurality of trenches 10T are formed at a region where the cavity sections 34 and 35 are to be formed. Subsequently, a high-temperature annealing treatment is carried out in an atmosphere of, for example, temperature of about 1100 degrees centigrade, pressure of about 1333 Pa, and hydrogen of 100% to migrate silicon at the periphery of the plurality of trenches 10T on the silicon layer 10. As a result, an opening each of the trenches 10T is closed, and the hermetically-sealed cavity sections 34 and 35 are formed (FIG. 6C). At this time, the top surface of the silicon layer 10 becomes almost flat.

Figure 7A:
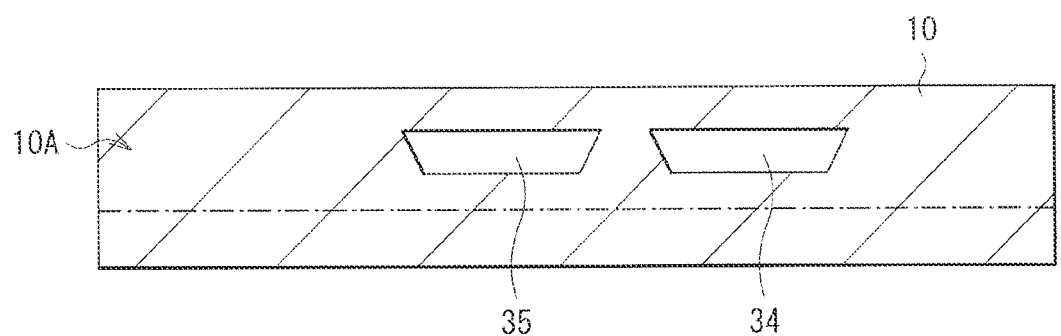
FIG. 7A is a cross-sectional view showing an example of a manufacturing process following on the manufacturing process shown in FIG. 6C.
Figure 7B:
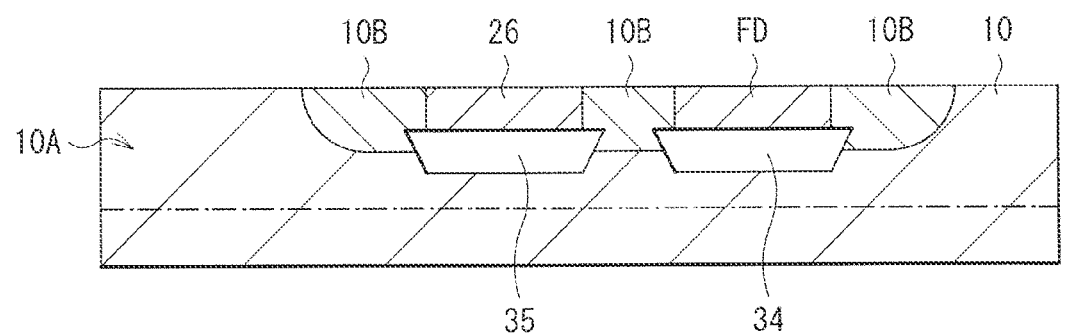
FIG. 7B is a cross-sectional view showing an example of a manufacturing process following on the manufacturing process shown in FIG. 7A.

Next, the well layer 10A is formed on a part of the top surface of the silicon layer 10 and in the vicinity thereof (FIG. 7A). Subsequently, the floating diffusion section FD and the channel body region 26 are formed on the well layer 10A, and separation regions 10B are formed as necessary on the side surfaces of the floating diffusion section FD and the channel body region 26 (FIG. 7B). The separation region 10B is a diffusive device separation region with the impurity concentration higher than that of the well layer 10A. Thereafter, the transfer transistor Tr1 and the readout circuit 12A are formed. In such a manner, the image pickup device 1 is manufactured.

[Operation]

Next, the description is provided on an example of the operation of the image pickup device 1. In the image pickup device 1, in the beginning, the reset transistor Tr2 and the transfer transistor Tr1 are put in a turn-on state. At this time, a potential of the floating diffusion section FD is reset to a potential of the power line VDD, and at the same time a predetermined voltage is applied to the photodiode PD. Subsequently, during a predetermined period of time, the reset transistor Tr2 remains in a turn-off state, and the transfer transistor Tr1 remains in a turn-on state. During this period of time, for example, when external light comes into the pixel region 11 via optical components such as a lens, a part of the incident light is subjected to photoelectric conversion by the photodiode PD, and a charge in the amount depending on the intensity of the incident light is accumulated for each of the pixels 12. The accumulated charges are collected on the transfer transistor Tr1 side by an electric field that is generated by a voltage applied to the pixel 12 to be temporarily accumulated in the floating diffusion section FD. Thereafter, when the transfer transistor Tr1 turns off and the selection transistor Tr3 turns on in a predetermined timing, the potential of the floating diffusion section FD is amplified, and a voltage in accordance with the amplified potential is output to the column processing circuit 14.

[Effects]

Next, the description is provided on the effects of the image pickup device 1. In the image pickup device 1, the cavity sections 34 and 35 that are hermetically-sealed with silicon are provided inside the silicon layer 10 and on both of the underside of the floating diffusion section FD and the underside of the channel body region 26 of the amplifying transistor Tr4. Therefore, a p-n junction region is not present on the bottom surfaces of the floating diffusion section FD and the channel body region 26, and thus a diffusion layer capacitance is reduced as compared with a case where a surrounding area each of the floating diffusion section FD and the channel body region 26 is the well layer 10A. As a result, it is possible to improve the conversion efficiency of the image pickup device 1. It is to be noted that, in the floating diffusion section FD and the channel body region 26 of the amplifying transistor Tr4, a proportion of the diffusion layer capacitance to total capacitance is significantly high. Accordingly, it is possible to improve the conversion efficiency of the image pickup device 1 more effectively by reducing the diffusion layer capacitance in the floating diffusion section FD and the channel body region 26 of the amplifying transistor Tr4 as compared with a case where the diffusion layer capacitance in other members is reduced.

(2. Modification Examples)

Next, the description is provided on modification examples of the image pickup device 1 according to this embodiment of the present technology.

FIRST MODIFICATION EXAMPLE

Figure 8:
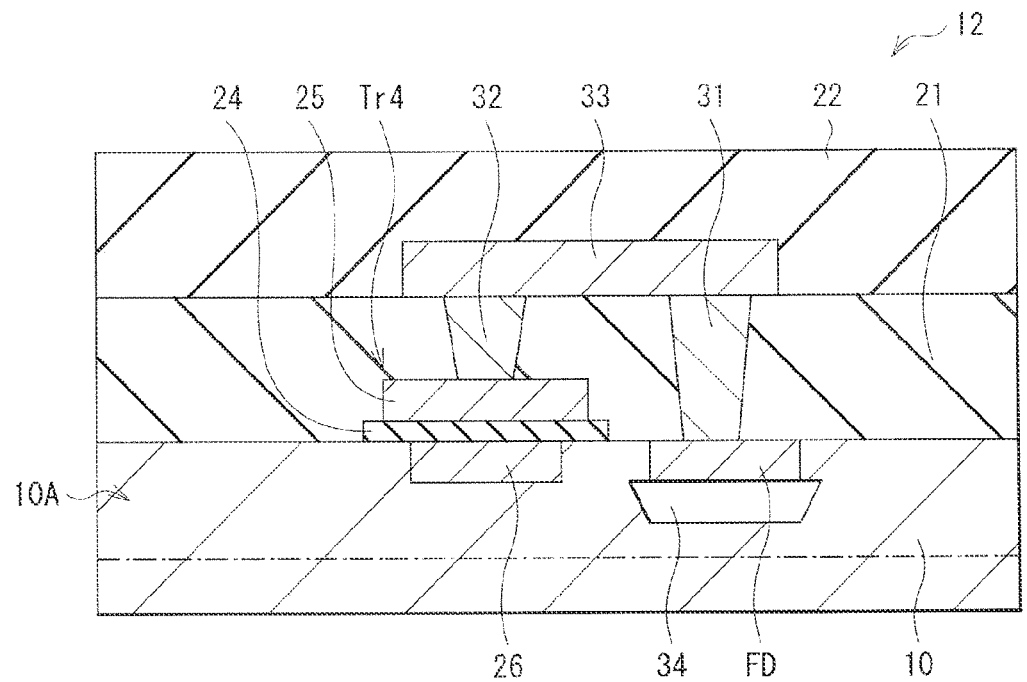
FIG. 8 is a schematic diagram showing an example of a partial cross-sectional configuration of a pixel according to a first modification example.
Figure 9:
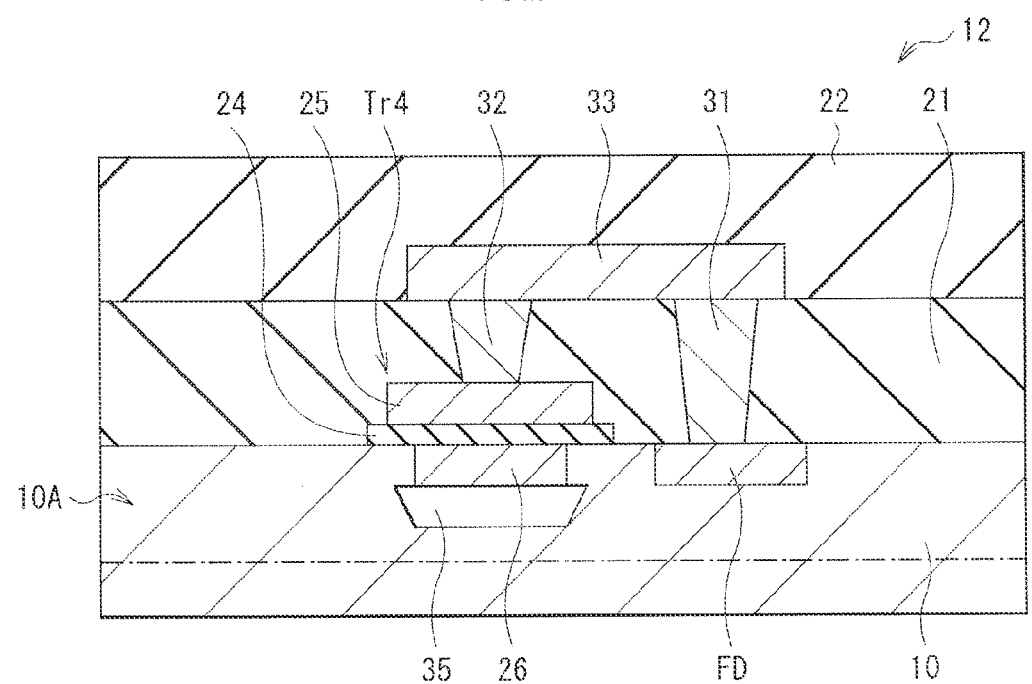
FIG. 9 is a schematic diagram showing another example of a partial cross-sectional configuration of the pixel according to the first modification example.

Each of FIG. 8 and FIG. 9 shows an example of a cross-sectional configuration of the image pickup device 1 according to a first modification example. FIG. 8 omits the cavity section 35 in the above-described embodiment, and FIG. 9 omits the cavity section 34 in the above-described embodiment. In any of these cases, a diffusion layer capacitance is reduced as compared with a case where a surrounding area each of the floating diffusion section FD and the channel body region 26 is the well layer 10A. As a result, it is possible to improve the conversion efficiency of the image pickup device 1.

SECOND MODIFICATION EXAMPLE

Figure 10:
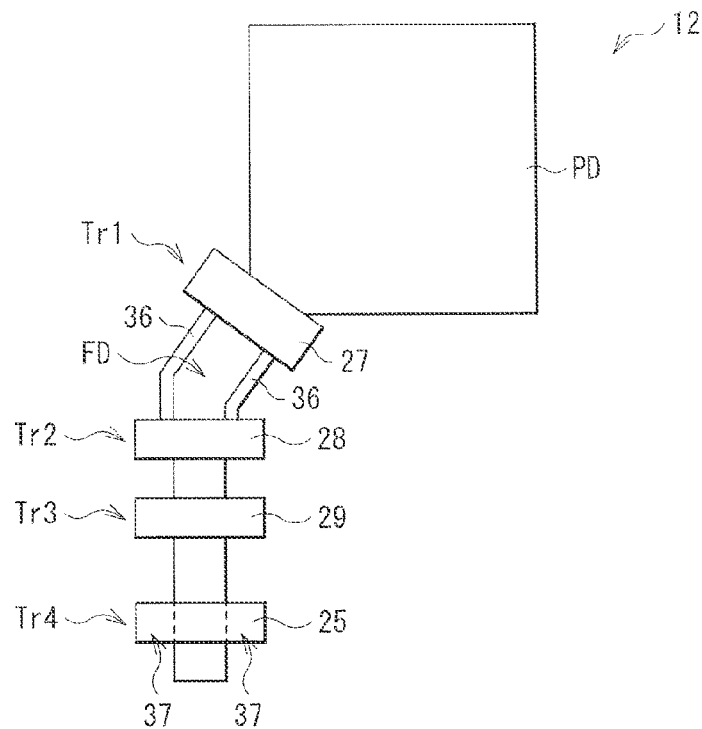
FIG. 10 is a schematic diagram showing an example of an in-plane layout of a pixel according to a second modification example.
Figure 11:
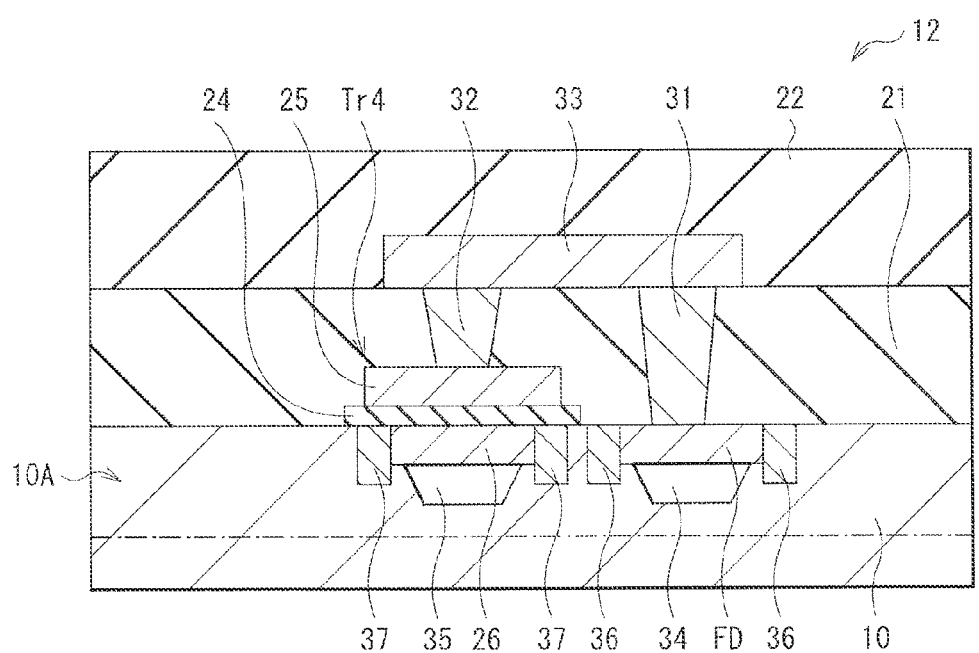
FIG. 11 is a schematic diagram showing an example of a partial cross-sectional configuration of the pixel illustrated in FIG. 10.

FIG. 10 shows an example of an in-plane layout of the pixel 12 in the image pickup device 1 according to a second modification example. FIG. 11 shows an example of a cross-sectional configuration of the pixel region 11 including the pixel 12 illustrated in FIG. 10. The image pickup device 1 according to this modification example corresponds to the image pickup device 1 according to the above-described embodiment in which separation sections 36 and 37 are provided on either side of the floating diffusion section FD and on either side of the channel body region 26. Each of the separation sections 36 and 37 is an STI device separation region that may be configured in a manner of, for example, embedding an insulating film, for example, a silicon oxide film into trenches that are formed on the silicon layer 10.

The separation section 36 is formed in contact with the floating diffusion section FD, and is formed away from the cavity section 35. In other words, in this modification example, the cavity section 35 is formed in contact with a region excluding an outer edge on the bottom surface of the floating diffusion section FD. The separation section 37 is formed in contact with the channel body region 26, and is formed away from the cavity section 34. In other words, in this modification example, the cavity section 34 is formed in contact with a region excluding an outer edge on the bottom surface of the channel body region 26.

In this modification example, not only the cavity sections 34 and 35 are provided, but also the separation sections 36 and 37 are provided on either side of the floating diffusion section FD and on either side of the channel body region 26. Therefore, a p-n junction region is hardly present on the bottom surfaces of the floating diffusion section FD and the channel body region 26, and further similarly a p-n junction region is hardly present as well on either side of the floating diffusion section FD and on either side of the channel body region 26. As a result, a diffusion layer capacitance is reduced as compared with a case where a surrounding area each of the floating diffusion section FD and the channel body region 26 is the well layer 10A, which makes it possible to improve the conversion efficiency of the image pickup device 1.

Figure 12:
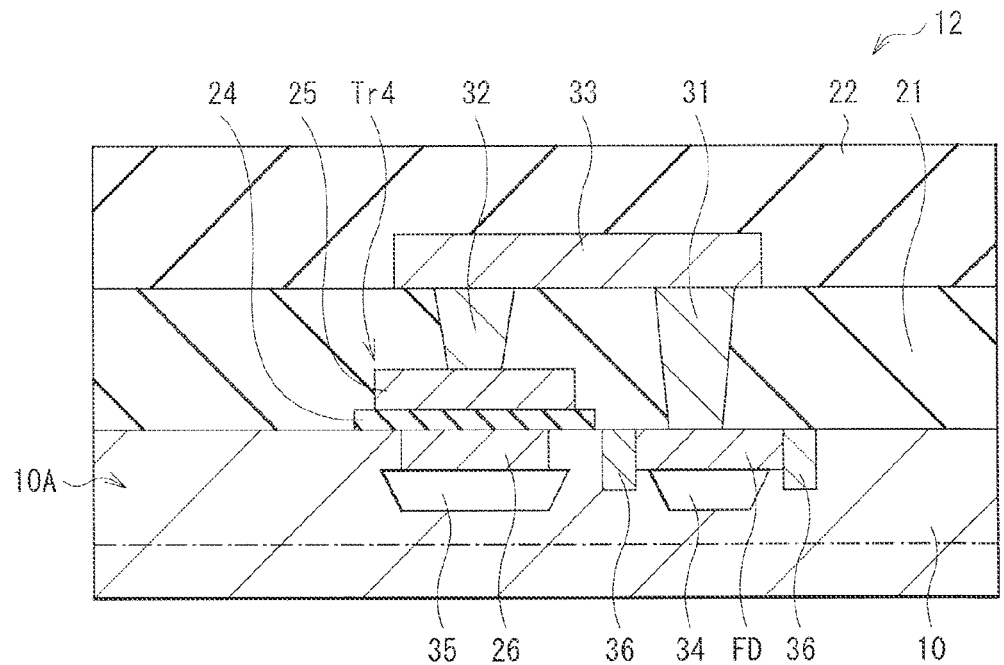
FIG. 12 is a schematic diagram showing an example of a partial cross-sectional configuration of the pixel according to the second modification example.
Figure 13:
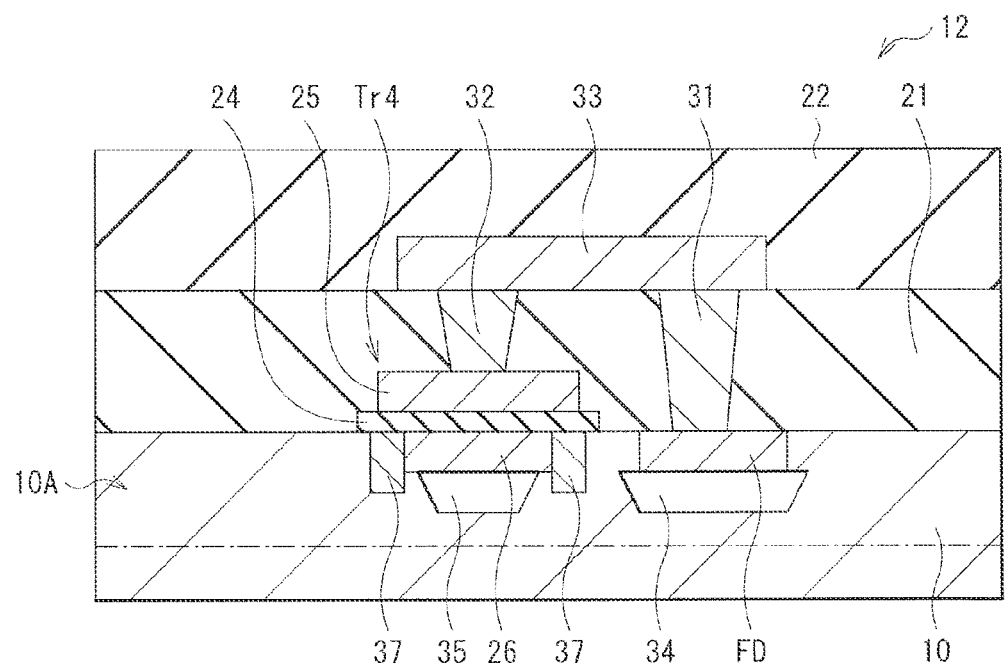
FIG. 13 is a schematic diagram showing another example of a partial cross-sectional configuration of the pixel according to the second modification example.

It is to be noted that, in this modification example, for example, as shown in FIG. 12 and FIG. 13, any one of the separation sections 36 and 37 may be omitted. In any of these cases, the diffusion layer capacitance is reduced as compared with a case where a surrounding area each of the floating diffusion section FD and the channel body region 26 is the well layer 10A. As a result, it is possible to improve the conversion efficiency of the image pickup device 1. When the separation section 37 is omitted, the cavity section 35 may be formed in contact with the whole bottom surface of the channel body region 26. Further, when the separation section 36 is omitted, the cavity section 34 may be formed in contact with the whole bottom surface of the floating diffusion section FD.

(3. Second Embodiment)

Figure 14:
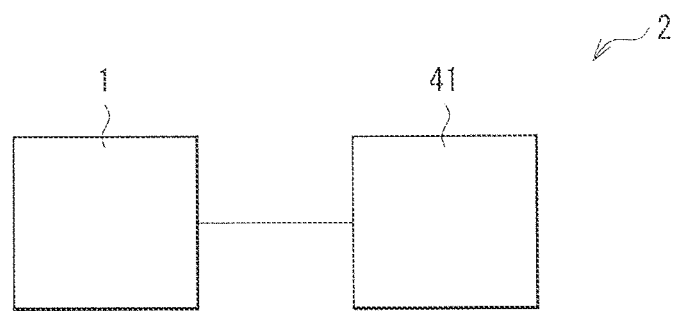
FIG. 14 is a schematic block diagram showing an example of a simplified configuration of an image pickup module according to a second embodiment of the present technology.

FIG. 14 shows a simplified configuration of an image pickup module 2 according to a second embodiment of the present technology. The image pickup module 2 includes the image pickup device 1 according to the above-described embodiment and modification examples thereof, and a signal processing circuit 41 that performs a predetermined processing operation for a pixel signal to be output from the image pickup device 1. The image pickup device 1 and the signal processing circuit 41 may be mounted on a single wiring substrate, for example. The signal processing circuit 41 may be configured of, for example, a DSP (Digital Signal Processor).

In this embodiment, the image pickup device 1 according to the above-described embodiment and modification examples thereof is mounted. This makes it possible to provide the high-sensitivity image pickup module 2.

(4. Third Embodiment)

Figure 15:
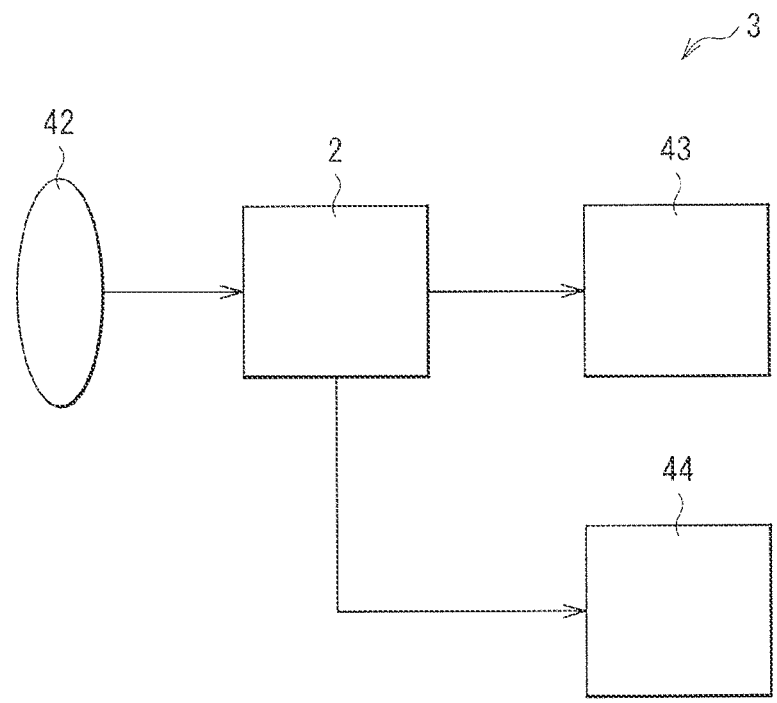
FIG. 15 is a schematic block diagram showing an example of a simplified configuration of an electronic apparatus according to a third embodiment of the present technology.

FIG. 15 shows a simplified configuration of an electronic apparatus 3 according to a third embodiment of the present technology. The electronic apparatus 3 includes the image pickup module 2 according to the above-described second embodiment, a lens 42 for making external light incident into the image pickup device 1 inside the image pickup module 2, a display unit 43 for displaying an output of the image pickup module 2 as an image, and a memory unit 44 for storing the output of the image pickup module 2. It is to be noted that the electronic apparatus 3 may not include the memory unit 44. In this case, the electronic apparatus 3 may include a writing unit for writing information on an external memory unit.

In this embodiment, the image pickup module 2 according to the above-described second embodiment is mounted. This makes it possible to provide the high-sensitivity electronic apparatus 3.

The present technology is described thus far with reference to the embodiments and the modification examples thereof. However, the present technology is not limited to the above-described embodiments and the like, and various modifications may be made.

It is possible to achieve at least the following configurations from the above-described example embodiments of the disclosure.

(1) An image pickup device, including on a silicon layer:
a photodiode provided on each pixel basis to perform photoelectric conversion to generate a charge depending on the light receiving amount;
a floating diffusion section configured to store the charge generated by the photodiode; and
a transistor configured to output a pixel signal at a voltage in accordance with a level of the charge stored in the floating diffusion section,
wherein the image pickup device further includes a hermetically-sealed cavity section inside the silicon layer and on at least one of the underside of the floating diffusion section and the underside of a channel body region of the transistor.

(2) The image pickup device according to (1), wherein the cavity section is formed in contact with the floating diffusion section when the cavity section is formed on the underside of the floating diffusion section, and the cavity section is formed in contact with the channel body region when the cavity section is formed on the underside of the channel body region.

(3) The image pickup device according to (1) or (2), wherein the cavity section is formed in such a manner that a hydrogen annealing treatment is carried out after a plurality of trenches are formed on the silicon layer, and silicon at the periphery of the plurality of trenches on the silicon layer is migrated.

(4) An electronic apparatus provided with an image pickup device and a signal processing circuit configured to carry out a predetermined processing operation for a pixel signal to be output from the image pickup device, the image pickup device including on a silicon layer:
a photodiode provided on each pixel basis to perform photoelectric conversion to generate a charge depending on the light receiving amount;
a floating diffusion section configured to store the charge generated by the photodiode; and
a transistor configured to output a pixel signal at a voltage in accordance with a level of the charge stored in the floating diffusion section,
wherein the image pickup device further includes a hermetically-sealed cavity section inside the silicon layer and on at least one of the underside of the floating diffusion section and the underside of a channel body region of the transistor.

It should be understood by those skilled in the art that various modifications, combinations, sub-combinations and alterations may occur depending on design requirements and other factors insofar as they are within the scope of the appended claims or the equivalents thereof.

What is claimed is:
1. An image pickup device, comprising:
a silicon layer;
a photodiode provided on the silicon layer and corresponding to a pixel that performs photoelectric conversion and generates a charge depending on a light-receiving amount;
a floating diffusion section configured to store the charge generated by the photodiode;
a transistor configured to output a pixel signal at a voltage in accordance with a level of the charge stored in the floating diffusion section; and
a hermetically-sealed cavity section inside the silicon layer and on at least one of an underside of the floating diffusion section and an underside of a channel body region of the transistor, wherein the hermetically-sealed cavity section is hollow.

2. The image pickup device according to claim 1, wherein the cavity section is formed in contact with the floating diffusion section when the cavity section is formed on the underside of the floating diffusion section, and the cavity section is formed in contact with the channel body region when the cavity section is formed on the underside of the channel body region.

3. The image pickup device according to claim 2, wherein the cavity section comprises a hydrogen annealed trench on the silicon layer with migrated silicon at a periphery of the trench.

4. An electronic apparatus, comprising:
an image pickup device on a silicon layer;
a signal processing circuit that carries out a predetermined processing operation for a pixel signal output from the image pickup device;
a photodiode corresponding to a pixel that performs photoelectric conversion and generates a charge depending on a light-receiving amount;
a floating diffusion section that stores the charge generated by the photodiode;
a transistor that outputs a pixel signal at a voltage in accordance with a level of the charge stored in the floating diffusion section; and
a hermetically-sealed cavity section inside the silicon layer and on at least one of an underside of the floating diffusion section and an underside of a channel body region of the transistor, wherein the hermetically-sealed cavity section is hollow.

5. The image pickup device according to claim 1, wherein the cavity section is formed on the underside of the floating diffusion section and on the underside of the channel body region.

6. The image pickup device according to claim 2, wherein the cavity section is formed on the underside of the floating diffusion section and on the underside of the channel body region.

7. The image pickup device according to claim 1, wherein the transistor is an amplifying transistor.

8. The image pickup device according to claim 2, wherein the transistor is an amplifying transistor.

9. The image pickup device according to claim 1, further comprising a well layer that surrounds each of the floating diffusion section and on the underside of the channel body region.

10. The image pickup device according to claim 9, wherein the well layer comprises a diffusion layer capacitance.

11. The image pickup device according to claim 2, further comprising a well layer that surrounds each of the floating diffusion section and the underside of the channel body region.

12. The image pickup device according to claim 11, wherein the well layer comprises a diffusion layer capacitance.

13. The electronic apparatus according to claim 4, wherein the cavity section is formed in contact with the floating diffusion section when the cavity section is formed on the underside of the floating diffusion section, and the cavity section is formed in contact with the channel body region when the cavity section is formed on the underside of the channel body region.

14. The electronic apparatus according to claim 13, wherein the cavity section comprises a hydrogen annealed trench on the silicon layer with migrated silicon at a periphery of the trench.

\* \* \* \* \*